United States Patent
Udayashankar et al.

(10) Patent No.: US 11,616,504 B2
(45) Date of Patent: *Mar. 28, 2023

(54) OPAMP OVERLOAD POWER LIMIT CIRCUIT, SYSTEM, AND A METHOD THEREOF

(71) Applicant: TEXAS INSTRUMENTS INCORPORATED, Dallas, TX (US)

(72) Inventors: Sudarshan Udayashankar, Marzling (DE); Martijn Fridus Snoeij, Erding (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/715,605

(22) Filed: Apr. 7, 2022

(65) Prior Publication Data

US 2022/0231680 A1    Jul. 21, 2022

Related U.S. Application Data

(63) Continuation of application No. 16/722,454, filed on Dec. 20, 2019, now Pat. No. 11,309,882.

(51) Int. Cl.
*H03K 17/082* (2006.01)
*H01L 29/66* (2006.01)

(52) U.S. Cl.
CPC ... *H03K 17/0826* (2013.01); *H01L 29/66234* (2013.01); *H03F 2200/504* (2013.01)

(58) Field of Classification Search
CPC ........ H01L 29/66234; H03F 2200/504; H03K 17/08146; H03K 17/0826

USPC .... 327/108; 330/290, 291, 298, 96, 97, 102, 330/103, 207 P; 361/93.9
See application file for complete search history.

(56) References Cited

U.S. PATENT DOCUMENTS

| | | |
|---|---|---|
| 4,337,494 A | 6/1982 | Huykman |
| 4,428,015 A | 1/1984 | Nesler |
| 5,621,601 A | 4/1997 | Fujihira et al. |
| 5,635,868 A * | 6/1997 | Aiello ............... H03K 17/08126 327/108 |
| 5,754,066 A | 5/1998 | Smith |
| 7,345,547 B2 | 3/2008 | Wang et al. |
| 7,675,346 B2 * | 3/2010 | Kesler .................... H03K 17/30 327/434 |
| 7,961,484 B2 | 6/2011 | Lalithambika et al. |
| 8,350,601 B2 * | 1/2013 | Nagata ................. H03K 17/168 327/108 |
| 2002/0186083 A1 * | 12/2002 | Brandt ................. H03G 3/3042 330/285 |
| 2007/0146952 A1 * | 6/2007 | Asada .................. H03K 17/145 361/100 |
| 2009/0040796 A1 | 2/2009 | Lalithambika et al. |

(Continued)

OTHER PUBLICATIONS

International Search Report in corresponding PCT Application No. PCT/US2020/066309, dated Mar. 18, 2021 (2 pages).

*Primary Examiner* — William Hernandez
(74) *Attorney, Agent, or Firm* — Michelle F. Murray; Frank D. Cimino

(57) ABSTRACT

An amplifier overload power limit circuit, system, and a method thereof comprising a monitoring of a current gain of a BJT based on a current detector and limiting power to the BJT based on the monitored current gain to prevent the BJT from driven into a saturation mode and the amplifier overdrive.

20 Claims, 4 Drawing Sheets

(56) References Cited

U.S. PATENT DOCUMENTS

2009/0170454 A1    7/2009   Hug et al.
2009/0322420 A1   12/2009   Singh

* cited by examiner

OPAMP OVERLOAD POWER LIMIT CIRCUIT, SYSTEM, AND A METHOD THEREOF

CROSS-REFERENCE TO RELATED APPLICATIONS

This application is a continuation of U.S. patent application Ser. No. 16/722,454, filed Dec. 20, 2019, which is hereby incorporated by reference in its entirety.

BACKGROUND

An amplifier with a bipolar junction transistor (BJT) may be driven into a saturation mode due to excessive base current driven to the BIT. Once the amplifier is overdriven, it takes time for the amplifier to recover to its normal state due to the Rif saturation. Accordingly, it is important to determine whether the BJT is about to be driven into the saturation mode and prevent such overdrive.

SUMMARY

According to an aspect of the present invention, a current gain of a BJT of a BJT amplifying circuit is monitored and a base current driven into the BJT is adjusted based on the current gain. In one example, where the current gain is below a preset value, the base current driven into the BJT is limited to prevent BJT from entering a saturation mode.

According to another aspect of the present invention, an emitter or collector current of a BJT of a BJT amplifying circuit is monitored and a base current adjusted only when the emitter or collector current is below a threshold current value. In other words, only when the emitter or collector current is below the threshold current value and when the current gain is below the present value the base current driven into the BJT is limited.

According to another aspect of the present invention, a limiting circuit is configured to limit a base current drive into a BJT of a BJT amplifying circuit based on a current gain of the BJT, determined by a current detector. A limiting circuit controller may be further provided to enable the limiting circuit to limit the base current when the emitter or collector current of the BJT, detected by the current detector, is below a threshold current value.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Figure 1:
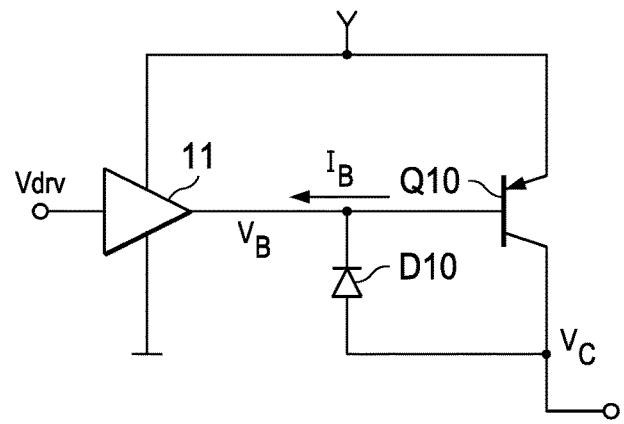
FIG. 1 illustrates an exemplary BJT amplifier.

FIG. 1 illustrates an exemplary BJT amplifier. In the BJT amplifier of FIG. 1, voltage Vdrv is supplied to amplifier 11 coupled to a base node of BJT Q10. When the amplifier 11 is overdriven through Vdrv, it causes the BJT Q10 to enter saturation mode. Further, when the exemplary BJT amplifier enters into the overload mode, collector node voltage $V_C$ of BJT Q10 is higher than base node voltage VB of BJT Q10. This activates inherent diode D10 connecting the collector node and the base node of BJT Q10, which in turn increase the base current $I_B$ fed into amplifier 11.

When a BJT amplifier enters into an overload mode, it takes time for the BJT amplifier to return to its normal mode especially if a base current drive to the BJT of the BJT amplifier is not limited. To prevent a BJT amplifier from entering into an overload mode, as well as prevent power consumption due to the BJT amplifier in the overload mode, an aspect of the present invention detects a current of a BJT of a BJT amplifier and regulates a base current flow into the BJT.

For example, a current gain of a BJT of a BJT amplifier is detected. When the current gain, which may be a ratio of an emitter or collector current of the BJT to a base current of the BJT, is below a preset value, the base current drive into the BJT is limited to prevent the BJT from entering into a saturation mode.

According to another example, the emitter or collector current of the BJT is compared against a threshold current value. The base current drive into the BJT is limited only when the current gain is below the preset value and the emitter or collector current is below the threshold current value. This is to provide an option of running the BJT amplifier in high current mode without limiting the base current drive into the BJT.

Examples of the present invention provide an analog solution to an analog problem, where the boundaries of saturation or overload are fuzzy. Limiting the base current flow into the BJT before the BJT enters into a saturation mode, based on a current of the BJT, provides a simple and efficient solution to such problem. Details of the examples are further provided in relation to FIGS. 2-6.

Figure 2:
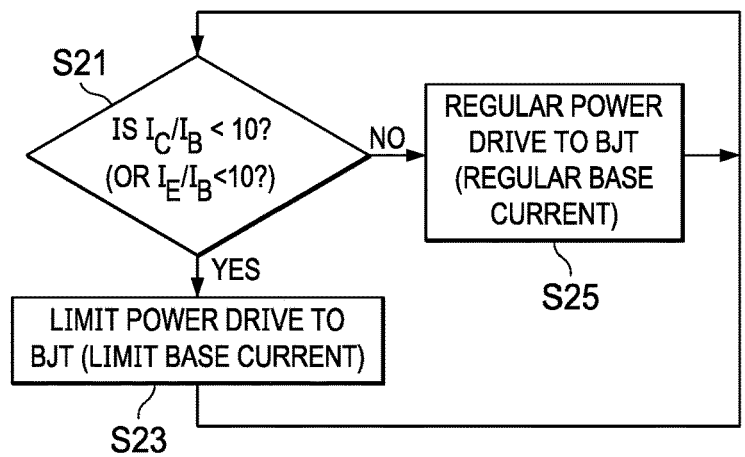
FIG. 2 illustrates a method of limiting power of a BJT amplifier according to an aspect of the present invention.

FIG. 2 illustrates a method of limiting power of a BJT amplifier according to an aspect of the present invention. In FIG. 2, a current gain, which is a ratio of collector current $I_C$ or emitter current $I_E$ to base current $I_B$ of a BJT, is compared to a preset value of 10 in step S21. When the current gain is below the preset value of 10, base current drive to the BJT is limited in step S23 to prevent the BJT from entering a saturation mode. When the current gain is not below the preset value of 10, however, base current drive to the BJT is not limited in step S25, and regular base current is applied to the BJT in step S25.

Figure 3:
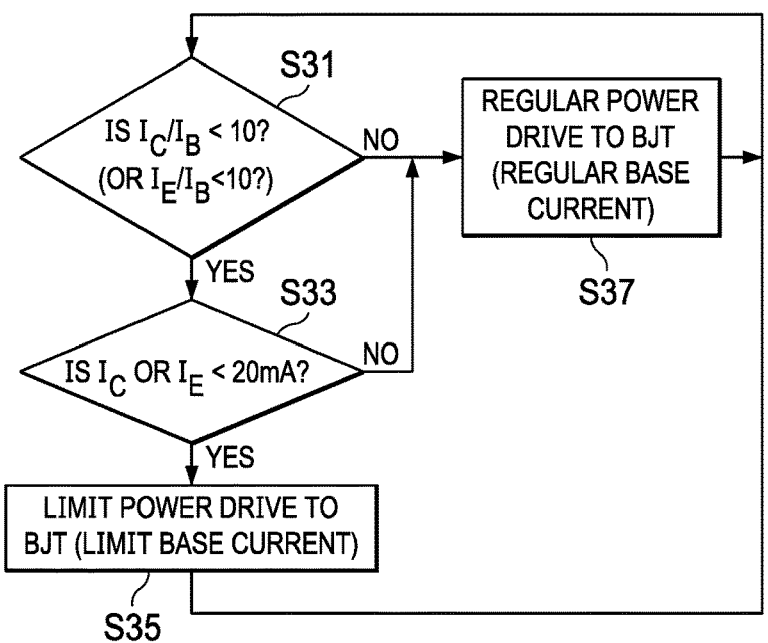
FIG. 3 illustrates a method of limiting power of a BJT amplifier according to yet another aspect of the present invention.

FIG. 3 illustrates a method of limiting power of a BJT amplifier according to yet another aspect of the present invention. In FIG. 3, a current gain is compared to a current gain, which is a ratio of collector current $I_C$ or emitter current $I_E$ to base current $I_B$ of a BJT, is compared to a preset value of 10 in step S31. When the current gain is below the preset value of 10, collector current $I_C$ or emitter current $I_E$ is further compared with a threshold current value of 20 mA in step S33. When collector current $I_C$ or emitter current $I_E$ is below 20 mA, base current drive to the BJT is limited in step S35 to prevent the BJT from entering a saturation mode.

When collector current $I_C$ or emitter current $I_E$ is not below 20 mA, however, it is assumed that the BJT amplifier is operating in a high current output mode by design or choice, and regular base current is applied to the BJT in step S37.

Figure 4:
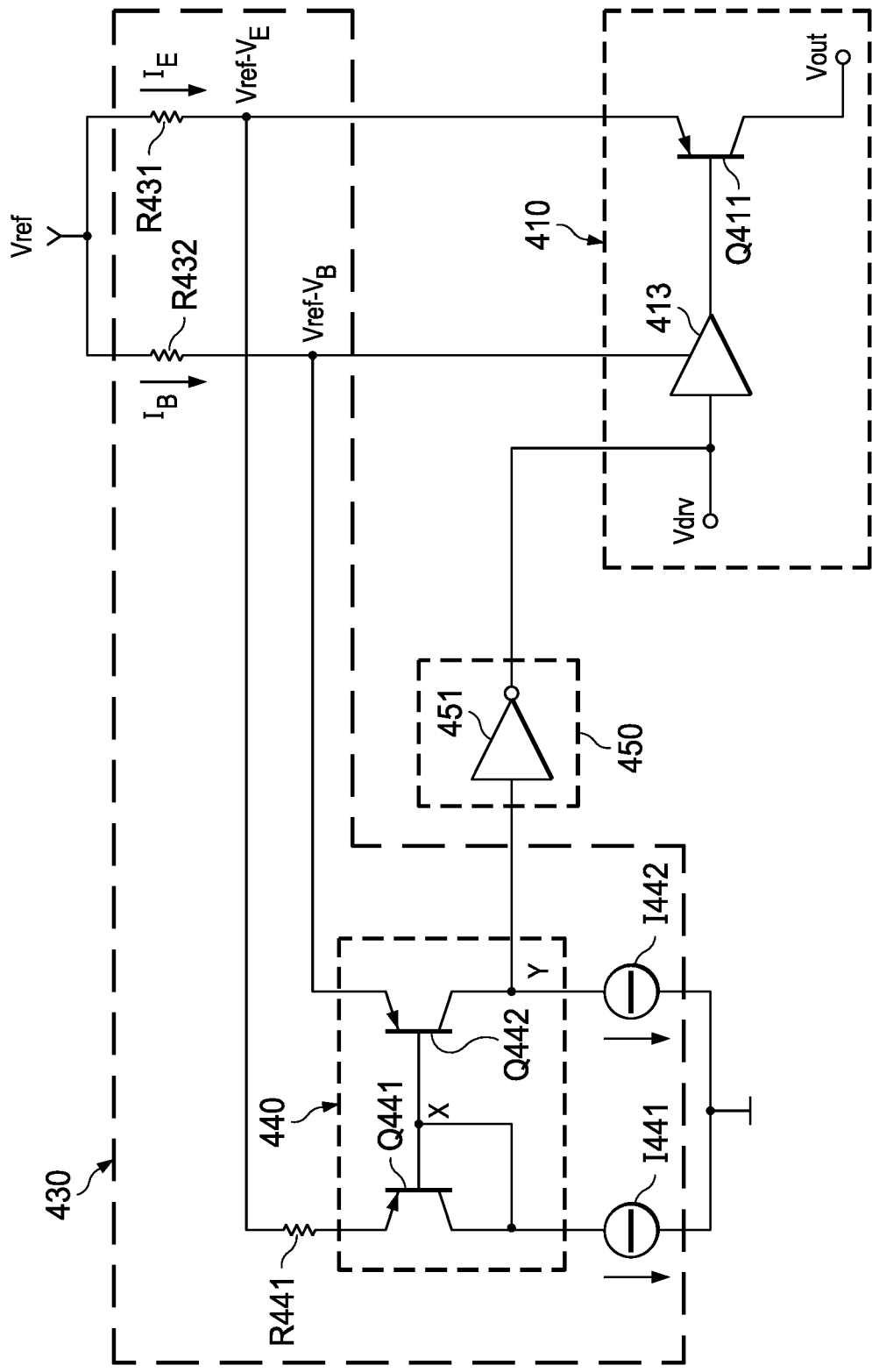
FIG. 4 illustrates a BJT amplifier system configured to limit a BJT from driving into a saturation mode according to yet another aspect of the present invention.

FIG. 4 illustrates a BJT amplifier system configured to limit a BJT from driving into a saturation mode according to yet another aspect of the present invention. In FIG. 4, the BJT amplifier system comprises BJT amplifier 410 with amplifier 413 and BJT Q411, current detector 430 coupled to BJT amplifier 410, and limiting circuit 450 coupled to BJT amplifier 410 and current detector 430. Current detector 430 is configured to detect a current gain of BJT Q411 based on an emitter or collector current of BJT Q411 and a base current of BJT Q411. Based on the current gain, limiting circuit 450 is configured to limit the base current drive to BJT Q411.

Base current is driven to BJT Q411 when voltage Vdrv is supplied to amplifier 413, which in turn drives the base current to BJT Q411. Limiting circuit 450 is configured to adjust the level of voltage Vdrv supplied to amplified based on the current gain. For example, when limiting circuit 450 comprises switch 451 as in FIG. 4, switch 451 turns off a path of voltage Vdrv to amplifier 413 when the current gain is below a preset value. When the path is turned off, base current drive from amplifier 413 to BJT Q411 is limited, which prevent BJT Q411 from entering a saturation mode.

When the current gain is above the preset value, switch 451 turns back on the path of voltage Vdrv to amplifier 413. When the path is turned on, based current drive from amplifier 413 to BJT Q411 resumes it regular value and BJT Q411 operates in a normal mode.

Current detector 430 of FIG. 4 comprises base current sensor R432 coupled to a base node of BJT Q411, emitter current sensor R431 coupled to an emitter node of BJT Q411, and comparator 440 coupled to base current sensor R432, emitter current sensor R431, and limiting circuit 450. Base current sensor R432, which may comprise a resistor, is configured to sense a base current $I_B$ of BJT Q411. Emitter current sensor R431, which may also comprise a resistor, is configured to sense an emitter current $I_E$ of BJT Q411. Comparator 440 compares the ratio of the emitter current $I_E$ to the base current $I_B$, which is one example of a current gain, with the preset value. When the ratio is below the preset value, comparator 440 enables limiting circuit 450 to limit the base current to BJT Q411.

In the example of FIG. 4, comparator 440 comprises BJT Q441 and BJT Q442. An emitter node of BJT Q441 is coupled to emitter current sensor R431, its base node to a base node of BJT Q442, and its collector node to its base node. An emitter node of BJT Q442 is coupled to the base node of BJT Q441, and its collector node to limiting circuit 450.

Under the configuration of FIG. 4, BJT Q442 is configured to be turned on stronger than BJT Q441 when the current gain is lower than the preset value. The current gain increases when the emitter current of BJT Q411 increases. One end of emitter current sensor R431 is coupled to a voltage reference with voltage Vref. When emitter current sensor R431 comprises a resistor, the voltage of the opposite end of emitter current sensor R431 can be denoted as Vref-$V_E$, where $V_E$ is voltage across the resistor of emitter current sensor R431. This, in turn, turns on BJT Q442 stronger than BJT Q441 because the base-emitter voltage of BJT Q442 is higher than the base-emitter voltage of BJT Q441. When BJT Q442 is turned on stronger than BJT Q441, the switch 451 of limiting circuit 450 is turned on to limit the base current drive to BJT Q441.

The example of FIG. 4 may comprise an optional threshold adjust resistor R441 coupled to emitter current sensor R431 and the emitter node of BJT Q441. The addition of threshold adjust resistor R441 conditions BJT Q442 to only turn on and off when the voltage Vref-$V_E$ exceeds the threshold established by threshold adjust resistor R411.

Current detector 430 of FIG. 4 further comprises current source 1441 coupled to the collector node of BJT Q441 and current source 1442 coupled to the collector node of BJT Q442. During a regular, normal operation, the current outputs of current sources 1441 and 1442 are equal in magnitude. The current outputs of current sources 1441 and 1442, however, are adjustable to introduce additional hysteresis. For example, the current output of current source 1441 may be higher than the current output of current source 1442, so that BJT Q442 is turned on stronger when the current gain is lower than the preset value.

Figure 5:
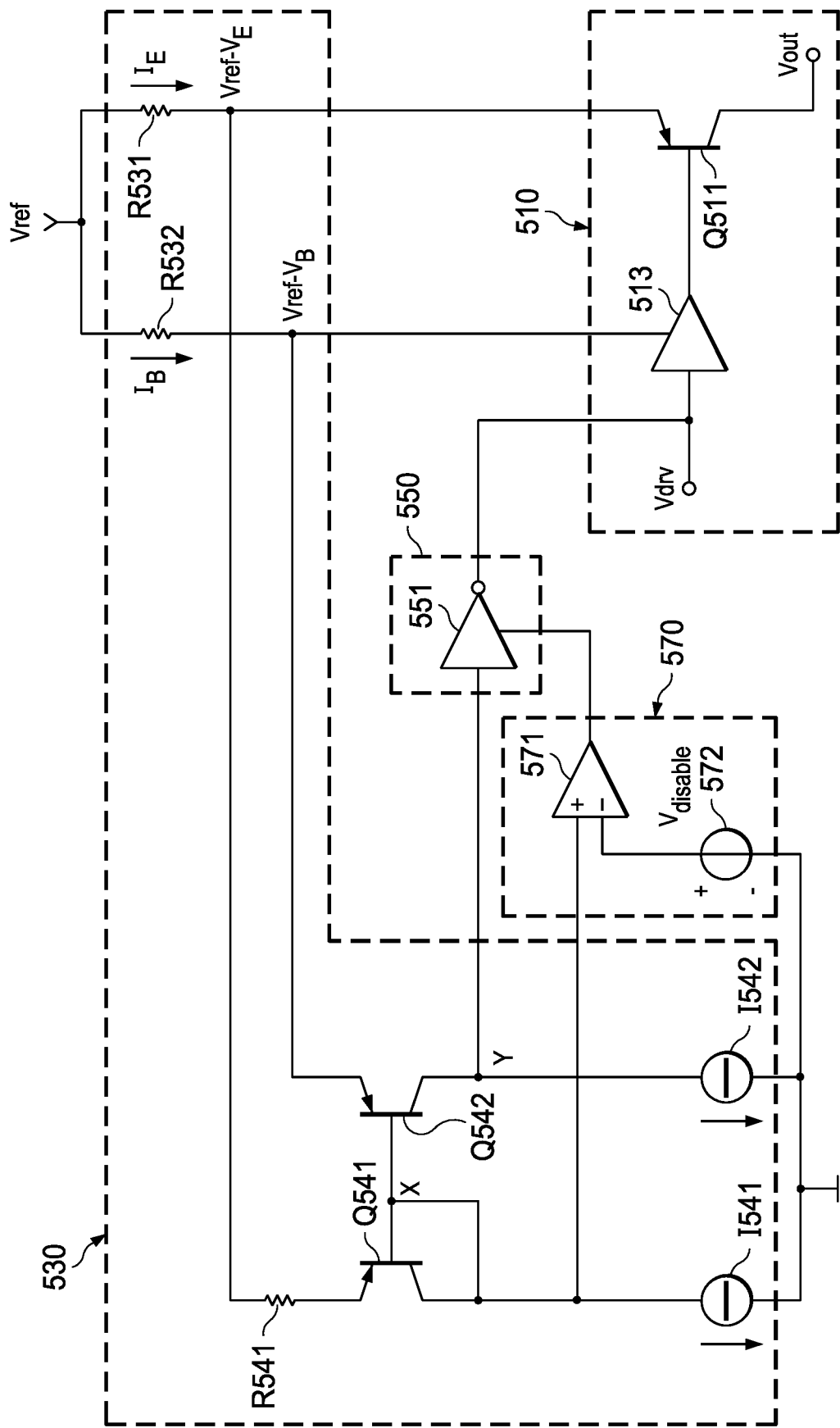
FIG. 5 illustrates a BJT amplifier system configured to limit a BJT from driving into a saturation mode according to yet another aspect of the present invention.
Figure 6:
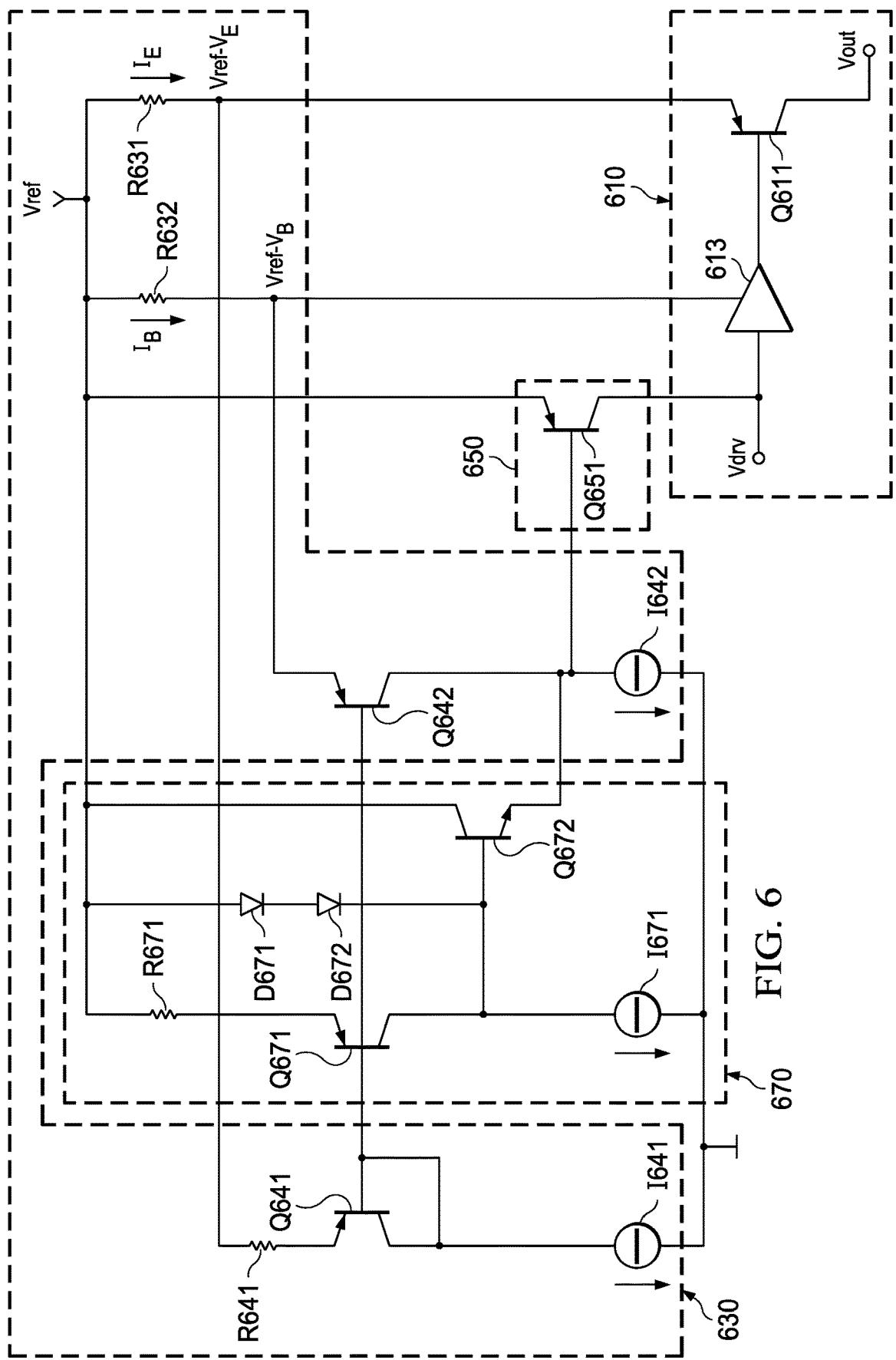
FIG. 6 illustrates a BJT amplifier system configured to limit a BJT from driving into a saturation mode according to yet another aspect of the present invention.

Each of FIGS. 5 and 6 illustrate a BJT amplifier system configured to limit a BJT from driving into a saturation mode according to yet another aspect of the present invention. In FIGS. 5 and 6, each of BJTs Q511, Q611 operates comparable to BJT Q411 of FIG. 4, amplifier 513, 613 to amplifier 413, BJTs Q541, 641 to BJT Q441, BJTs Q542, 642 to BJT Q442, current sources 1541, 1641 to current source 1441, current sources 1542, 1642 to current source 1442, emitter current sensors R531, R631 to emitter current sensor R431, base current sensor R532, 632 to base current sensor R432, limiting circuits 550, 650 to limiting circuit 450, current detectors 530, 630 to current detector 430, and threshold adjust resistors R541, R641 to threshold adjust resistor R441.

In FIG. 5, the BJT amplifier system further comprises limiting circuit controller 570 coupled to current detector 530 and limiting circuit 550. Limiting circuit controller 570 enables the limiting circuit 550 to limit the base current drive to BJT Q511 when the detected emitter or collector current of BJT Q511 is below a threshold current value. When limiting circuit 550 is enabled, it limits the base current drive to BJT Q511 when the current gain is below the preset value.

Limiting circuit controller 570 further disables limiting circuit 550 when the detected emitter or collector current of BJT Q511 is above the threshold current value. In other words, when the detected emitter or collector current of BJT Q511 is above the threshold current value, it is assumed that the BJT amplifier system is operating in a high current mode by design or choice and limiting circuit 550 does not limit the base current drive to BJT Q511. Limiting circuit 550 of FIG. 5 comprises switch 551, which operate comparable to switch 451 of FIG. 4.

Limiting circuit controller 570 comprises voltage comparator 571 coupled to the collector node of BJT Q541 and limiting circuit 550, and reference voltage source 572 coupled to voltage comparator 571. Voltage comparator 571 is configured to compare a voltage of the collector node of BJT Q541 with a voltage output of reference voltage source 572. When the voltage of the collector node BJT Q541 is higher than the voltage output of reference voltage source 572, voltage comparator 571 enables limiting circuit 570. When the voltage of the collector node BJT Q541 is lower than the voltage output of reference voltage source 572, however, it is assumed that the BJT amplifier system of FIG. 5 is operating in a high current mode and voltage comparator 771 disables limiting circuit 550.

In FIG. 6, the BJT amplifier system further comprises limiting circuit controller 670 coupled to current detector 630 and limiting circuit 650. Limiting circuit controller 670 enables the limiting circuit 650 to limit the base current drive to BJT Q611 when the detected emitter or collector current of BJT Q611 is below a threshold current value. When limiting circuit 650 is enabled, it limits the base current drive to BJT Q611 when the current gain is below the preset value.

Limiting circuit controller 670 further disables limiting circuit 650 when the detected emitter or collector current of BJT Q611 is above the threshold current value. In other words, when the detected emitter or collector current of BJT Q611 is above the threshold current value, it is assumed that the BJT amplifier system is operating in a high current mode by design or choice and limiting circuit 650 does not limit the base current drive to BJT Q511. Limiting circuit 650 comprises BJT Q651, which operate comparable to switch 451 of FIG. 4.

Limiting circuit controller 670 comprises BJT Q671, current source 1671 coupled to BJT Q671, and BJT Q672 coupled to BJT Q671 and limiting circuit 650. Limiting circuit controller further comprises diodes D671, D672 to protect BJT Q672 from overload and threshold adjust resistor R671.

A base node of BJT Q671 is coupled to a base node of BJT Q641, its emitter node to a reference voltage source with voltage Vref, and its collector node to current source 1671. A base node of BJT Q672 is coupled to the controller node of BJT Q671, its collector node to the reference voltage source with voltage Vref, and its emitter node to the collector node of BJT Q642.

BJT Q671 is configured to output a collector current larger than current source 1671 and turn on BJT Q672 when the emitter current of BJT Q611 is higher than the threshold current value. In such case, limiting circuit 650 is disabled. When the emitter current of BJT Q611 is smaller than the threshold current value, however, BJT Q671 is configured to output a collector current smaller than current source 1671, which, in turn, turn off BJT Q672. Turning off of BJT Q682 enables limiting circuit 650 to limit base current drive to BJT Q611 when the current gain is below the preset value.

Modifications are possible in the described embodiments, and other embodiments are possible, within the scope of the claims.

What is claimed is:

1. A circuit comprising:
   a bipolar junction transistor (BJT) amplifier comprising:
      a BJT; and
      an amplifier coupled to the BJT;
   a current detector coupled to the BJT and to the amplifier; and
   a limiting circuit coupled to the amplifier and to the current detector.

2. The circuit of claim 1, wherein the current detector comprises:
   a base current sensor coupled to the amplifier;
   an emitter current sensor coupled to an emitter of the BJT; and
   a comparator coupled to the base current sensor, the emitter current sensor, and the limiting circuit.

3. The circuit of claim 2, wherein the comparator comprises:
   a first comparator BJT; and
   a second comparator BJT coupled to the first comparator BJT,
   wherein an emitter of the first comparator BJT is coupled to the emitter current sensor, a base of the first comparator BJT is coupled to a base of the second comparator BJT, a collector of the first comparator BJT is coupled to the base of the first comparator BJT, an emitter of the second comparator BJT is coupled to the base current sensor, and a collector of the second comparator BJT is coupled to the limiting circuit.

4. The circuit of claim 3, wherein the circuit further comprises:
   a reference voltage source;
   wherein the emitter current sensor comprises a first resistor; and the base current sensor comprises a second resistor.

5. The circuit of claim 3, wherein the current detector further comprises a threshold adjust resistor coupled to the emitter current sensor and the emitter of the first comparator BJT.

6. The circuit of claim 3, wherein the current detector further comprises a first current source coupled to the collector of the first comparator BJT, and a second current source coupled to the collector of the second comparator BJT.

7. The circuit of claim 1, further comprising:
   a limiting circuit controller coupled to the current detector and the limiting circuit.

8. The circuit of claim 7, wherein the current detector comprises:
   an emitter current sensor coupled to an emitter of the BJT of the BJT amplifier;
   a base current sensor coupled to the amplifier;
   a first comparator BJT coupled to the emitter current sensor; and
   a second comparator BJT coupled to the base current sensor, wherein an emitter of the first comparator BJT is coupled to the emitter current sensor, a base of the first comparator BJT is coupled to a base of the second comparator BJT, a collector of the first comparator BJT is coupled to the base of the first comparator BJT, an emitter of the second comparator BJT is coupled to the base current sensor, and a collector of the second comparator BJT is coupled to the limiting circuit.

9. The circuit of claim 8, wherein the limiting circuit controller comprises:
   a voltage comparator coupled to the collector of the first second comparator BJT and the limiting circuit; and
   a reference voltage source coupled to the voltage comparator.

10. The circuit of claim 8, wherein the limiting circuit controller, comprises:
    a first controller BJT;
    a limiting circuit controller current source coupled to the first controller BJT; and
    a second controller BJT coupled to the first controller BJT and the limiting circuit,
    wherein a base of the first controller BJT is coupled to a base of the first comparator BJT, an emitter of the first controller BJT is coupled to a reference voltage source, and a collector of the first controller BJT is coupled to the limiting circuit controller current source,
    wherein a base of the second controller BJT is coupled to the collector of the first controller BJT, a collector of the second controller BJT is coupled to the reference voltage source, and an emitter of the second controller BJT is coupled to the collector of the second comparator BJT and the limiting circuit.

11. A circuit comprising,
    a bipolar junction transistor (BJT) amplifier comprising a first BJT;

a limiting circuit coupled to the BJT amplifier; and
a current detector coupled to the BJT amplifier and to the limiting circuit, the current detector comprising:
- a base current sensor coupled to a base of the BJT;
- an emitter current sensor coupled to an emitter of the BJT; and
- a comparator coupled to the base current sensor, to the emitter current sensor, and to the limiting circuit, the comparator comprising:
  - a second BJT coupled to the emitter current sensor; and
  - a third BJT coupled to the base current sensor and to the limiting circuit.

12. The circuit of claim 11, wherein an emitter of the second BJT is coupled to the emitter current sensor, a base of the second BJT is coupled to a base of the third BJT, a collector of the second BJT is coupled to the base of the second BJT, an emitter of the third BJT is coupled to the base current sensor, and a collector of the third BJT is coupled to the limiting circuit.

13. The circuit of claim 12, wherein the circuit further comprises:
- a reference voltage source; and
- wherein the emitter current sensor comprises a first resistor; and the base current sensor comprises a second resistor, the first resistor coupled to the reference voltage source and the second resistor coupled to the reference voltage source.

14. The circuit of claim 12, wherein the current detector further comprises a threshold adjust resistor coupled to the emitter current sensor and the emitter of the second BJT.

15. The circuit of claim 12, wherein the current detector further comprises a first current source coupled to the collector of the second BJT, and a second current source coupled to the collector of the third BJT.

16. The circuit of claim 11, further comprising:
- a limiting circuit controller coupled to the current detector and the limiting circuit.

17. The circuit of claim 16, wherein the limiting circuit controller comprises:
- a voltage comparator coupled to a collector of the second BJT and the limiting circuit; and
- a reference voltage source coupled to the voltage comparator.

18. The circuit of claim 16, wherein the limiting circuit controller comprises:
- a first controller BJT;
- a limiting circuit controller current source coupled to the first controller BJT; and
- a second controller BJT coupled to the first controller BJT and the limiting circuit,
- wherein a base of the first controller BJT is coupled to a base of the second BJT, an emitter of the first controller BJT is coupled to a reference voltage source, and a collector of the first controller BJT is coupled to the limiting circuit controller current source,
- wherein a base of the second controller BJT is coupled to the collector of the first controller BJT, a collector of the second controller BJT is coupled to the reference voltage source, and an emitter of the second controller BJT is coupled to a collector of the third BJT and the limiting circuit.

19. A circuit comprising:
- a transistor having a first current terminal, a second current terminal, and a control terminal;
- an amplifier coupled to the control terminal;
- a first current sensor coupled to the first current terminal;
- a second current sensor coupled to the amplifier;
- a switch coupled to the amplifier; and
- a comparator coupled to the first current sensor, to the second current sensor, and to the switch.

20. The circuit of claim 19, wherein the transistor is a first transistor, and the comparator further comprises:
- a second transistor coupled to the first current sensor; and
- a third transistor coupled to the second current sensor and to the switch.

* * * * *